(12) United States Patent
Kang et al.

(10) Patent No.: US 8,726,119 B2
(45) Date of Patent: May 13, 2014

(54) FAST STOCHASTIC DECODE METHOD FOR LOW DENSITY PARITY CHECK CODE

(75) Inventors: Jung Won Kang, Seoul (KR); Il Hong Shin, Daejeon (KR); Jeong Ju Yoo, Daejeon (KR); Won Ryu, Daejeon (KR); Jeongseok Ha, Daejeon (KR); Donghyub Kang, Daejeon (KR); Kais Azzouzi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 648 days.

(21) Appl. No.: 12/974,505

(22) Filed: Dec. 21, 2010

(65) Prior Publication Data

US 2011/0154150 A1    Jun. 23, 2011

(30) Foreign Application Priority Data

Dec. 21, 2009   (KR) .................. 10-2009-0128053

(51) Int. Cl.
*H03M 13/05* (2006.01)

(52) U.S. Cl.
USPC ........................................ 714/752

(58) Field of Classification Search
USPC ........................................ 714/752
See application file for complete search history.

(56) References Cited

U.S. PATENT DOCUMENTS

| | | | | |
|---|---|---|---|---|
| 8,099,645 | B2* | 1/2012 | Djordjevic et al. | 714/752 |
| 8,108,760 | B2* | 1/2012 | Gross et al. | 714/781 |
| 2008/0077839 | A1* | 3/2008 | Gross et al. | 714/755 |
| 2009/0172493 | A1* | 7/2009 | Park et al. | 714/752 |
| 2009/0259912 | A1* | 10/2009 | Djordjevic et al. | 714/752 |
| 2009/0282320 | A1* | 11/2009 | Liao et al. | 714/784 |
| 2010/0074381 | A1* | 3/2010 | Gross et al. | 375/346 |
| 2011/0138255 | A1* | 6/2011 | Lee | 714/777 |
| 2011/0154150 | A1* | 6/2011 | Kang et al. | 714/752 |
| 2011/0231731 | A1* | 9/2011 | Gross et al. | 714/760 |
| 2011/0255612 | A1* | 10/2011 | Bernstein et al. | 375/259 |
| 2011/0293045 | A1* | 12/2011 | Gross et al. | 375/340 |
| 2012/0047415 | A1* | 2/2012 | Djordjevic et al. | 714/756 |
| 2012/0054576 | A1* | 3/2012 | Gross et al. | 714/752 |
| 2013/0007551 | A1* | 1/2013 | Krishnan et al. | 714/752 |
| 2013/0073922 | A1* | 3/2013 | Varnica et al. | 714/758 |

FOREIGN PATENT DOCUMENTS

| KR | 10-2007-0079513 | 8/2007 |
|---|---|---|
| KR | 10-2008-0053346 | 6/2008 |
| KR | 10-2009-0062086 | 6/2009 |
| KR | 1020080081586 A | 9/2009 |

\* cited by examiner

*Primary Examiner* — Amine Riad
(74) *Attorney, Agent, or Firm* — Kile Park Reed & Houtteman PLLC (57) ABSTRACT

Provided is a fast stochastic decoding method for a low density parity check (LDPC) code. The decoding method may include decoding the LDPC code based on an LDPC decoding scheme, using a message expressed by a log-likelihood ratio (LLR) value.

6 Claims, 9 Drawing Sheets

| $P_a$ | 1 | 0 | 1 | 1 | 0 | 0 | 1 | 0 | 1 | 0 |
|---|---|---|---|---|---|---|---|---|---|---|
| $P_b$ | 1 | 0 | 0 | 0 | 1 | 1 | 0 | 0 | 1 | 0 |
| $P_c$ | 1 | 0 | 0 | 0 | 0 | 0 | 0 | 0 | 1 | 0 |

FAST STOCHASTIC DECODE METHOD FOR LOW DENSITY PARITY CHECK CODE

CROSS-REFERENCE TO RELATED APPLICATION

This application claims the priority benefit of Korean Patent Application No. 10-2009-0128053, filed on Dec. 21, 2009, in the Korean Intellectual Property Office, the disclosure of which is incorporated herein by reference.

BACKGROUND

1. Field

Example embodiments relate to a fast stochastic decoding method for a low density parity check (LDPC) code, and more particularly, to a decoding method that may reduce a number of iterations of decoding, using a new variable mode updating method.

2. Description of the Related Art

A low density parity check (LDPC) code, which is an error correction code, has provided performance similar to the channel capacity of Shannon by utilizing a message passing algorithm, such as a belief propagation (BP) algorithm. However, embodying hardware of a decoder of the LDPC code is a complex matter. A stochastic computation scheme has been used as one of schemes to embody a low precision digital circuit, and expresses a probability value by a bit stream and thus, a floating point operation may be performed using a binary operation.

A BP decoder uses a message expressed by the floating point and thus, a complexity in embodying the decoder increases and routing congestion occurs.

Recently, the stochastic decoder among LDPC decoders has been drawing attention. The stochastic decoder stochastically converts, based on a density of bit 1, a message probability value used in a conventional BP decoder to a bit stream corresponding to the probability value of the message and thus, has a structure enabling a binary operation and has a feature of increasing a decoding speed and decreasing an operation complexity. To overcome the deficiencies of the conventional BP decoder, the stochastic decoder embodies a parity check node and a variable node using a binary operator, by applying the stochastic computation scheme and thus, allows a high-speed decoding with a low complexity. The stochastic decoder converts a single message to a binary bit stream and thus, may perform a greater number of iterations of decoding than the conventional BP decoder.

The LDPC code was proposed by Robert G. Gallager in 1962. Although the LDPC shows performance similar to the channel capacity of Shannon, the LDPC code has been ignored until recent due to a high complexity in embodying a decoder, and studies on the LDPC are now actively conducted. In a parity check matrix of the LDPC code, a number of '1' is relatively small.

Figure 1:
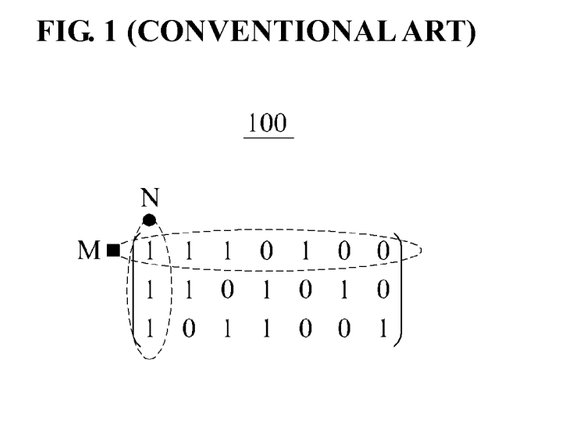
FIG. 1 is a diagram illustrating a parity check matrix of a low density parity check (LDPC) code in a conventional art.

FIG. 1 illustrates a parity check matrix of an LDPC code.

Referring to FIG. 1, in a matrix 100 of M×N, N may denote a number of columns and may be the same as a length of a codeword, and M may denote a number of rows and may be the same as a number of parity check equations.

Figure 2:
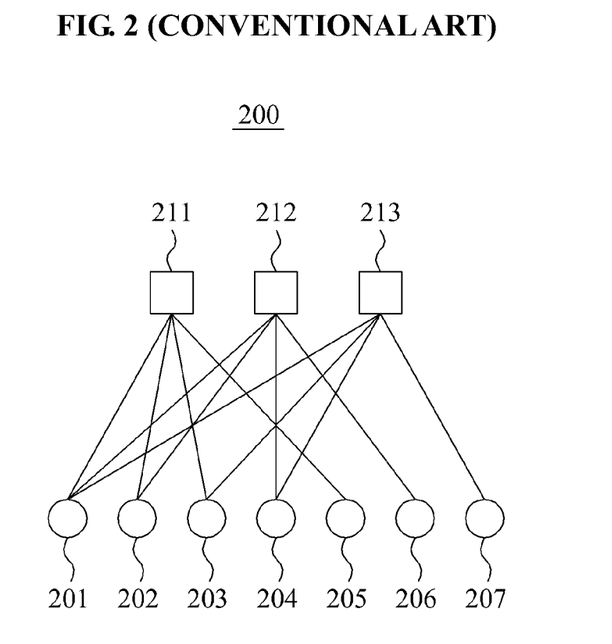
FIG. 2 is a diagram illustrating a parity check matrix of an LDPC code, expressed in a tanner graph in a conventional art.

FIG. 2 illustrates a parity check matrix of an LDPC code, expressed in a Tanner graph.

Referring to FIG. 2, circles 201, 202, 203, 204, 205, 206, and 207 may denote variable nodes and may indicate columns in the matrix 100. Squares 211, 212, and 213 may denote check nodes and may indicate rows in the matrix 100. Each node may be connected by an edge with each other. The edge may be dependent (determined based) on a location of an element that is different from '0' in the matrix 100. When a check node i and a check node j are connected by an edge, an element $h_{ij}$ may have a value different from '0' in the matrix 100. A number of edges connected to a node is referred to as a degree of the node. When the variable node has a constant degree of $d_v$ and the check node has a constant degree of $d_c$, the LDPC code may be referred to as a regular LDPC code. When the degree of the variable node and/or the degree of the check node are not constant, the LDPC code may be referred to as an irregular LDPC code.

The LDPC code is decoded to obtain, from a signal $\bar{r}$ received from a channel, a codeword $\bar{c}$ satisfying a condition of Equation 1.

$$\bar{c}H = 0 \qquad \text{[Equation 1]}$$

The BP decoder performs decoding by exchanging a message through an edge that connects a variable node with a parity check node, as one of message passing algorithms. In the present example, operations performed in each node may be referred to as a node updating process. During the decoding iteration process, each node may exchange messages with neighbors connected by edges, using the messages received from the previous iteration process. A message of parity check node $c_i$ expressed by probability values may be updated as expressed by Equation 2.

$$p_{c_i} = p_{v_1}(1-p_{v_2}) + (1-p_{v_1})p_{v_2} \qquad \text{[Equation 2]}$$

Figure 3:
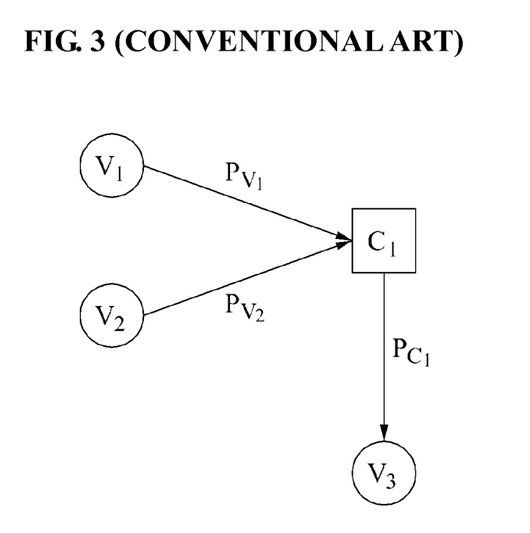
FIG. 3 is a diagram illustrating an example of parity check node updating in a conventional art.

FIG. 3 illustrates an example of parity check node updating.

Referring to FIG. 3, $V_1$ and $V_2$ may be variable nodes adjacent to a parity check node $c_i$. A variable node $v_i$ may be updated as expressed by Equation 3.

$$p_{v_i} = \frac{p_{c_1} p_{c_2}}{p_{c_1} p_{c_2} + (1 - p_{c_1})(1 - p_{c_2})} \qquad \text{[Equation 3]}$$

Figure 4:
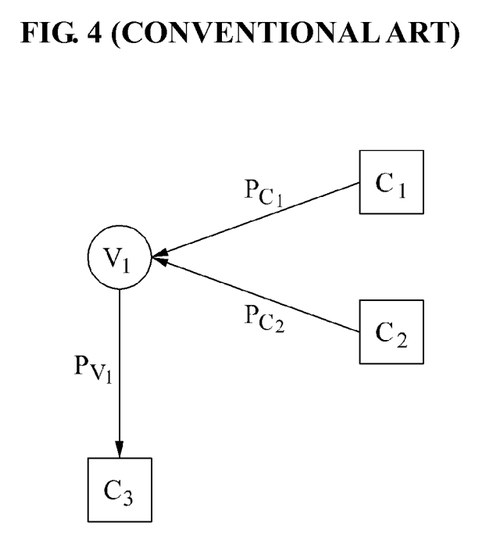
FIG. 4 is a diagram illustrating an example of a variable node updating in a conventional art.

FIG. 4 illustrates an example of a variable node updating.

Referring to FIG. 4 and Equation 3, $C_1$ and $C_2$ may be parity check nodes adjacent to the variable node.

When a probability value to be used for updating a parity check node and a variable node of the BP decoder is calculated, a complex circuit that is capable of performing floating point operations, while embodying hardware, may be used. A stochastic computation scheme applies a probability value in a range of [0, 1] to infinite in a Bernoulli sequence and thus, may easily calculate the probability value.

Figure 5:
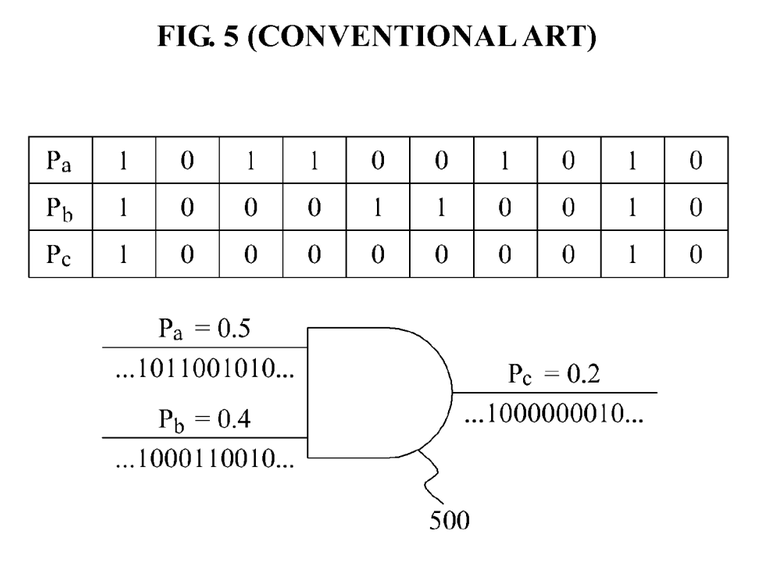
FIG. 5 is a diagram illustrating a multiplication of two probability values, and the multiplication is expressed, by logical AND operators, using stochastic computation in a conventional art.

FIG. 5 illustrates a multiplication of two probability values, and the multiplication is expressed, by a logical AND operator 500, using stochastic computation.

Referring to FIG. 5, each probability value may be the same as a value obtained by dividing a number of '1' in a bit stream by a length of the bit stream. A stochastic decoder may use a bit stream corresponding to a probability value as a message and thus, may update each node using the logical AND operator 500.

Figure 6:
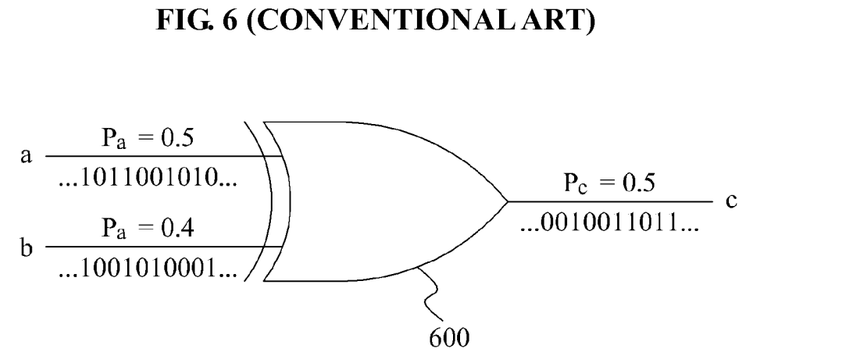
FIG. 6 is a diagram illustrating the check node updating of FIG. 3, using a logical XOR operator in a conventional art.

FIG. 6 illustrates the check node updating of FIG. 3, using a logical XOR operator 600.

Referring to FIG. 6, the parity check node updating of FIG. 3 may be performed by the XOR operator 600.

Figure 7:
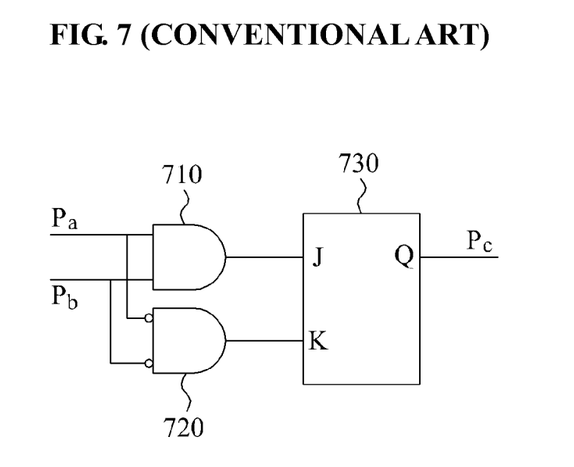
FIG. 7 is a diagram illustrating the variable node updating of FIG. 4, using two logical AND operators and a JK flip-flop in a conventional art.

FIG. 7 illustrates the variable node updating of FIG. 4, using two logical AND operators 710 and 720 and a JK flip-flop 730.

Referring to FIG. 7, the variable node updating of FIG. 4 may be performed by the two logical AND operators 710 and 720 and the JK flip-flop 730.

When all input message bits received from neighbor parity check nodes and a channel are the same, variable node updating based on a stochastic computation scheme may be updated to the same bit, otherwise and when at least one of the input message bits received from neighbor parity check nodes and a channel is different variable node updating may be in a hold state. The hold state may suppress message exchanging, thereby leading to performance deterioration of the decoder, and may increase a number of iterations of decoding for successful decoding.

An edge memory proposed by Tehrani selects an appropriate bit from among past messages stored in a memory when the updating is in the hold state and thus, may show performance similar to the BP decoder. However, the scheme may perform a greater number of iterations of decoding, compared with the BP decoder.

SUMMARY

Example embodiments may provide a decoding method that decodes a low density parity check (LDPC) code, using a lower number of iterations of decoding and a lower error floor, compared with a conventional Stochastic decoder.

Example embodiments may provide a decoding method that decodes an LDPC code based on an LDPC decoding scheme, using a message expressed by a log-likelihood ratio (LLR) value.

The foregoing and/or other aspects are achieved by providing a fast stochastic decoding method for an LDPC code, the method including decoding, by a signal receiving apparatus of a communication system, the LDPC code based on an LDPC decoding scheme, using a message expressed by an LLR value.

The message may be expressed by converting the LLR value to a corresponding bit stream.

The decoding may include updating a variable node based on a bit stream.

The updating may include performing a binary operation between input message values.

The updating may include counting, by a first counter, a case where all input messages from a parity check node are '1' and an input message from a channel is '0', and counting, by a second counter, a case where all the input messages from the parity check node are '0' and the input message from the channel is '1'.

The updating may include using a threshold as an input value from the channel.

The updating may include disregarding the input message from the channel when updating the variable node, from when a difference between a first counter value counted by the first counter and a second counter value counted by the second counter is greater than the threshold.

The foregoing and/or other aspects are achieved by providing a fast stochastic decoding method for a low density parity check (LDPC) code, the method including updating a variable node only based on a message received from a parity check node without using a message received from a channel, when a decoder is in a convergence phase where the decoder converges to successful decoding.

Additional aspects of embodiments will be set forth in part in the description which follows and, in part, will be apparent from the description, or may be learned by practice of the disclosure.

EFFECT

The example embodiments may include a decoder for a low density parity check (LDPC) code, which shows the same error rate as a conventional decoder and provides a lower number of iterations of decoding and a lower error floor, compared with the conventional decoder.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. Embodiments are described below to explain the present disclosure by referring to the figures.

A fast stochastic decoding method for a low density parity check (LDPC) code that may include a decoder that may decode the LDPC code based on an LDPC decoding scheme, using a message expressed by a log-likelihood ratio (LLR) value, and that may detect the decoded LDPC code. The decoder may express the LLR value by converting a bit stream corresponding to the LLR value. The decoding may include a variable node updating process using the bit stream. The variable node updating process may include performing of a binary operation between input message values. The variable node updating process may use a variable node updating algorithm as illustrated in Table 1.

TABLE 1

```
Input: Messages from neighboring check nodes
Output: Messages to neighboring check nodes
for each Variable node v do
    Sum = Σincoming messages to m
    switch Sum do
        case 0
            All messages to neighboring checks are 0;
            Update Edges memories:
            Update Counter:
        end
        case 1
            if BitFromChannel[r] = 1 then
                CounterAllCheck0s[v]+ +:
                if CounterAllCheckk0s[v] - CounterAllCheck1s[v] > Th
                then
                    All messages to neighboring checks are 0:
                    Update Edges memories:
                    Update Counter:
                end
                else
                    take messages from edges memories:
                end
            end
            else
                there exist a regenerative bit equal to 0 and all other
                messages are from memories;
            end
        end
        case d_v
            if BitFromChannel[v] = 0 then
                CounterAllCheck1s[v]+ +:
                if CounterAllCheck1s[v] - CounterAllCheck0s[v] > Th
                then
                    All messages to neighboring checks are 1;
                    Update Edges memories:
                    Update Counter:
                end
                else
                    take messages from edge memories
                end
            end
            else
                there exist a regenerative bit equal to 1 and all other
                messages are from memories;
            end
        end
        case d_v + 1
            All messages to neighboring checks are 1:
            Update Edges memories:
            Update Counter:
        end
        otherwise
            All messages are from edge memories:
        end
    end
end
```

Referring to Table 1, all variable nodes include two counters.

A first counter may count a number of cases where all bits received from a parity check node are '1' and a bit received from a channel is '0'.

A second counter may count a number of cases where all the bits received from the parity check node are '0' and the bit received from the channel is '1'.

During the variable node updating process, the decoder may use a predetermined threshold as an input value from the channel.

A channel message may not be used for the variable node updating process, from when a difference between a coefficient value with respect to the first counter and a coefficient value with respect to the second counter is greater than a predetermined threshold. Therefore, the variable node updating process may not use the input message from the channel since the different between a first counter value counted by the first counter and a second counter value counted by the second counter is greater than the threshold.

When the decoder is in a convergence phase where the decoder converges to successful decoding, the decoder may update the variable nodes only based on a message received from the parity check node without using the message received from the channel.

Figure 8:
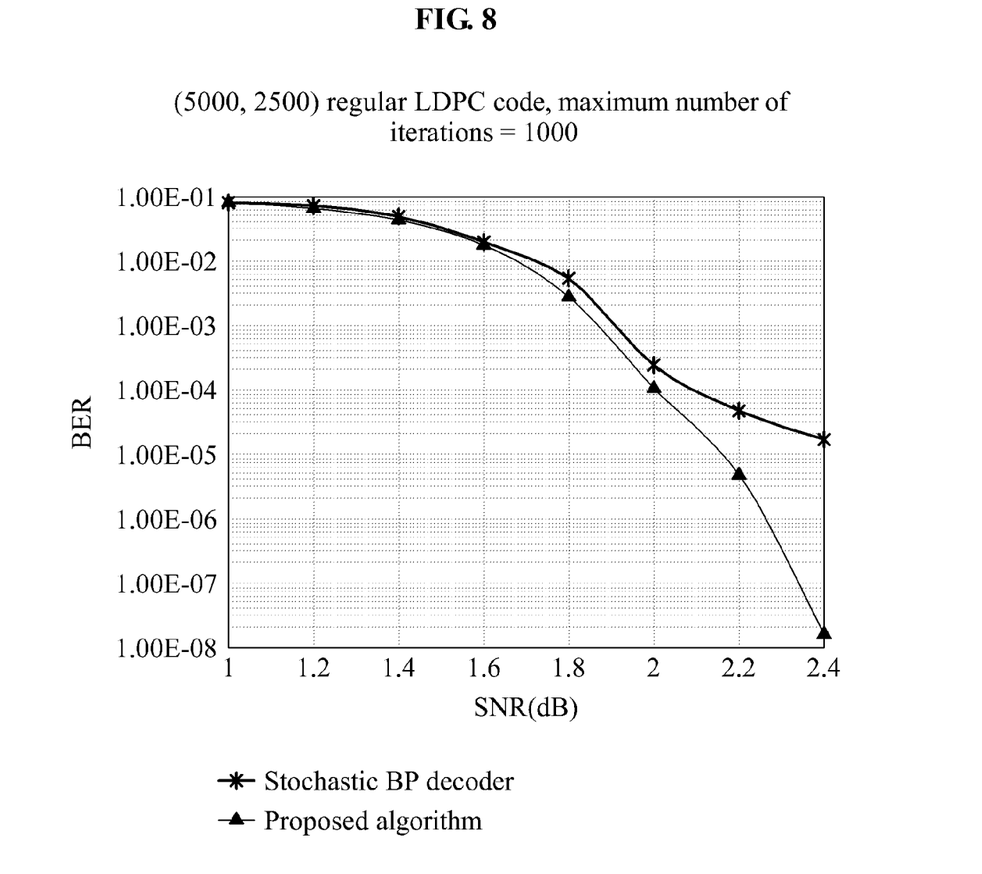
FIG. 8 is a graph illustrating a bit error rate performance of a stochastic decoder and a bit error rate performance of a decoder according to an example embodiment.

FIG. 8 is a graph illustrating a bit error rate performance of a stochastic decoder and a bit error rate performance of a decoder according to an example embodiment.

Referring to FIG. 8, a used code is a (3, 6) normal LDPC code that has a code rate of ½, a code length of 5000, a variable node degree of 3, and a check node degree of 6. A maximal number of iterations of decoding may be 1000. In this example, a binary phase shift keying (BPSK) scheme may be used as a modulation scheme, and the BPSK scheme shows the same performance as in an additive white Gaussian noise channel environment. The decoder has a significantly lower error floor, compared with the conventional stochastic decoder.

Figure 9:
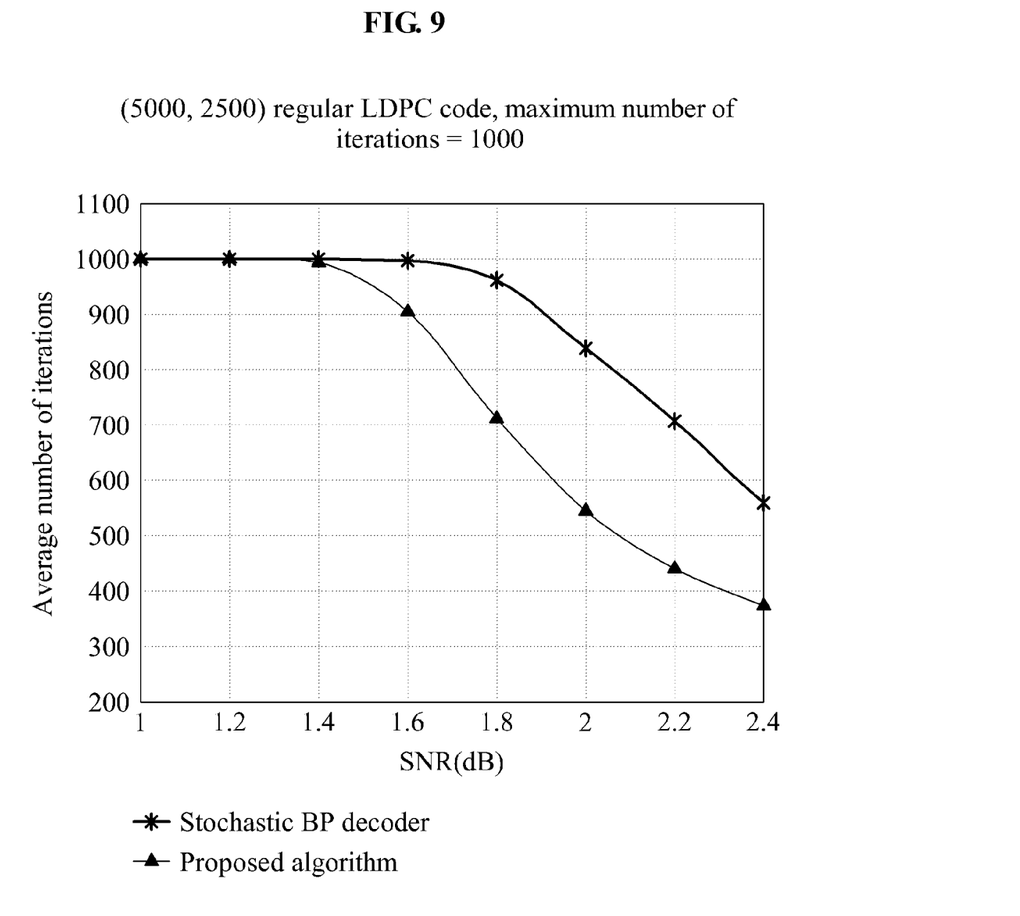
FIG. 9 is a graph illustrating comparison between a number of average iterations of a stochastic decoder and a number of average iterations of a decoder according to an example embodiment.

FIG. 9 illustrates comparison between a number of average iterations of a stochastic decoder and a number of average iterations of a decoder according to an example embodiment.

Referring to FIG. 9, a used code is a (3, 6) normal LDPC code that has a code rate of ½, a code length of 5000, a variable node degree of 3, and a check node degree of 6. A maximal number of iterations of decoding may be 1000. In this example, a BPSK scheme may be used as a modulation scheme, and the BPSK scheme shows the same performance as in an additive white Gaussian noise channel environment. The decoder has a significantly smaller number of average iterations of decoding, compared with the conventional stochastic decoder.

The decoding method for the LDPC code may have the same error rate as the conventional decoder, and may provide the lower error floor and the smaller number of iterations, compared with the conventional decoder.

Although embodiments have been shown and described, it would be appreciated by those skilled in the art that changes may be made in these embodiments without departing from the principles and spirit of the disclosure, the scope of which is defined by the claims and their equivalents.

What is claimed is:

1. A fast stochastic decoding method, the method comprising:
   decoding, by a signal receiving apparatus of a communication system, the LDPC code based on an LDPC decoding scheme, using a message expressed by a log-likelihood ratio (LLR) value,
   wherein the decoding comprises updating a variable node, and
   wherein the updating comprises counting, by a first counter, a case where all input messages from a parity check node are '1' and an input message from a channel is '0', and counting, by a second counter, a case where all the input messages from the parity check node are '0' and the input message from the channel is '1'.

2. The method of claim 1, wherein the message is expressed by converting the LLR value to a corresponding bit stream.

3. The method of claim 1, wherein the updating comprises: performing a binary operation between input message values.

4. The method of claim 1, wherein the updating comprises: using a threshold as an input value from the channel.

5. The method of claim 4, wherein the updating comprises: disregarding the input message from the channel when updating the variable node, from when a difference between a first counter value counted by the first counter and a second counter value counted by the second counter is greater than the threshold.

6. A fast stochastic decoding method, the method comprising:
    updating a variable node only based on a message received from a parity check node without using a message received from a channel, when a decoder is in a convergence phase where the decoder converges to successful decoding.

* * * * *